United States Patent
Hirayama et al.

(10) Patent No.: US 6,286,454 B1
(45) Date of Patent: Sep. 11, 2001

(54) PLASMA PROCESS DEVICE

(75) Inventors: Masaki Hirayama; Tadahiro Ohmi, both of Sendai; Tatsushi Yamamoto, Ikoma-gun; Takamitsu Tadera, Tenri, all of (JP)

(73) Assignees: Tadahiro Ohmi, Sendai; Sharp Kabushiki Kaisha, Osaka, both of (JP)

( * ) Notice: Subject to any disclaimer, the term of this patent is extended or adjusted under 35 U.S.C. 154(b) by 0 days.

(21) Appl. No.: 09/583,161

(22) Filed: May 30, 2000

(30) Foreign Application Priority Data

May 31, 1999 (JP) .................................................. 11-151799
Nov. 30, 1999 (JP) .................................................. 11-339785

(51) Int. Cl.[7] .............................. C23C 16/00; H05H 1/00
(52) U.S. Cl. .............................. 118/723 MW; 118/723 E; 156/345
(58) Field of Search .................................. 118/723 MW, 118/723 ME, 723 MR, 723 E; 156/345; 315/111.21, 111.31, 111.41, 111.51, 111.61, 111.71

(56) References Cited

U.S. PATENT DOCUMENTS

| 5,003,152 | * | 3/1991 | Matsuo et al. | 219/121.59 |
| 5,487,875 | * | 1/1996 | Suzuki | 422/186.05 |
| 5,741,364 | * | 4/1998 | Kodama et al. | 118/723 MP |

FOREIGN PATENT DOCUMENTS

| 5-86480 | 4/1993 | (JP) . |
| 6-49647 | 2/1994 | (JP) . |
| 6-61153 | 3/1994 | (JP) . |
| 6-333697 | 12/1994 | (JP) . |
| 7-130494 | 5/1995 | (JP) . |
| 8-321399 | 12/1996 | (JP) . |
| 9-111461 | 4/1997 | (JP) . |
| 9-181048 | 7/1997 | (JP) . |
| 11-297672 | 10/1999 | (JP) . |

* cited by examiner

Primary Examiner—Gregory Mills
Assistant Examiner—P. Hassanzadeh
(74) Attorney, Agent, or Firm—Dike, Bronstein, Roberts & Cushman IP Group of Edwards & Angell, LLP; David G. Conlin; David A. Tucker

(57) ABSTRACT

A plasma process device capable of forming homogeneous plasma and coping with a large size substrate less costly can be obtained. The plasma process device includes a processing chamber, microwave guiding device, a shower plate and a reaction gas supply passage. The microwave guiding device guides a microwave into the processing chamber. The shower plate has a gas inlet hole to supply to the processing chamber a reaction gas attaining a plasma state by the microwave, and a lower surface facing the processing chamber and an upper surface positioned on the opposite side of the lower surface. The reaction gas supply passage is a positioned on the upper surface of the shower plate and supplies the reaction gas to the gas inlet hole. A wall surface of the reaction gas supply passage includes an upper surface of the shower plate and a conductor wall surface opposing the upper surface.

27 Claims, 11 Drawing Sheets

PLASMA PROCESS DEVICE

BACKGROUND OF THE INVENTION

1. Field of the Invention

The present invention relates to plasma process devices, and more specifically, to a plasma process device capable of performing a processing such as deposition, etching and ashing to a large size, rectangular glass substrate using plasma.

2. Description of the Background Art

Conventional plasma process devices to perform deposition, etching and ashing using plasma are known. One of known methods of generating plasma in such a plasma process device is an electron cyclotron resonance plasma excitation method according to which plasma is excited using a microwave and a DC magnetic field. In the electron cyclotron resonance plasma excitation method, however, stable plasma results only if the pressure is set to a level of several mTorr or less at the time of generating plasma. In addition, since the electron temperature in plasma is high, the plasma formed using the electron cyclotron resonance plasma excitation method is not suitable for the process such as deposition as described above. In the electron cyclotron resonance plasma excitation method, a DC magnetic field must be applied, which necessitates the entire device to have a large size. As a result, the manufacturing cost of the plasma process device is disadvantageously high.

Meanwhile, there is a known method of exciting plasma using the surface wave mode of microwave propagating through dielectric rather than using an electron cyclotron resonance method with a DC magnetic field as described above. The plasma excitation method using the surface wave of a microwave can produce stable plasma if the pressure is set in a relatively broad range from several ten mTorr to several Torr or higher, Since the electron temperature in the plasma is relatively low, surface wave excited plasmas are suitable for any of the above processings such as deposition may result.

In a process such as plasma CVD (Chemical Vapor Deposition) and etching, a reaction gas must be introduced uniformly over the entire surface of substrate subject to a reactive process. This is to assure process condition uniformity for deposition, etching or the like over the entire substrate. As one known means for achieving this is the use of a shower plate to supply a reaction gas in a plasma process device. Herein, the shower plate refers to a plate shaped member positioned to oppose a substrate to be processed and having a plurality of reaction gas inlets to introduce a reaction gas into a processing chamber in which the substrate is placed.

As a conventional plasma process device using a method of exciting plasma using the surface wave of a microwave as described above together with a shower plate, a plasma process device using a radial line slot antenna has been known. FIG. 16 is a schematic cross sectional view of a conventional plasma process device using a radial line slot antenna. Referring to FIG. 16, the plasma process device will be described.

Referring to FIG. 16, plasma process device 150 includes a vacuum vessel 156 as a processing chamber, a shower plate 153, a dielectric plate 152, a radial line slot antenna 151 and an exhaust pump 155. In vacuum vessel 156, a circular substrate 154 subjected to deposition process or the like is placed on a substrate holder. Shower plate 153 of dielectric is provided on the upper wall surface of vacuum vessel 156 opposing substrate 154. Dielectric plate 152 is provided above shower plate 153 with a gap 163 therebetween. Radial line slot antenna 151 is provided on dielectric plate 152. Shower plate 153, dielectric plate 152 and radial line slot antenna 151 have a circular shape when viewed from the top. A reaction gas inlet passage 157 is formed to connect the gap 163 between shower plate 153 and dielectric plate 152. A reaction gas introduced to gap 163 from reaction gas inlet passage 157 is let into vacuum vessel 156 through the gas inlets formed in shower plate 153.

Substantially homogeneous plasma 158 is formed over the entire surface of substrate 154 from the reaction gas by the microwave introduced into vacuum vessel 156 from radial line slot antenna 151 through dielectric plate 152, gap 163 and shower plate 153 formed of dielectric. With plasma 158, a processing such as deposition may be performed on the surface of substrate 154. The reaction gas which have not contributed to the processing and the gas generated by the reaction at the substrate surface are let out of vacuum vessel 156 through exhaust pump 155.

FIG. 17 is a perspective cross sectional view of the radial line slot antenna shown in FIG. 16. Referring to FIG. 17, the radial line slot antenna will be described.

Referring to FIG. 17, radial line slot antenna 151 includes a coaxial waveguide 160, a ground plate 159 formed of conductor, a dielectric plate 161 and a slot plate 164 of conductor having slots 162. Dielectric plate 161 is provided under ground plate 159. A slot plate 164 is provided under dielectric plate 161. Coaxial waveguide 160 is connected to dielectric plate 161. A microwave is transmitted to dielectric plate 161 from coaxial waveguide 160. Dielectric plate 161 serves as a radial microwave transmission path. A microwave is radiated through slots 162 formed in slot plate 164 from the entire bottom surface of radial line slot antenna 151.

In the conventional plasma process device using the radial line slot antenna, plasma excitation with a microwave and uniform supply of a reaction gas to the processing chamber using the shower plate are simultaneously performed. The plasma process device using the radial line slot antenna described above suffers from the following problem.

More specifically, referring to FIG. 16, in the conventional plasma process device, a microwave used to form plasma 158 is supplied from radial line slot antenna 151 into vacuum vessel 156 as a processing chamber through dielectric plate 152, gap 163 and shower plate 153. At this time, gap 163 serving as a transmission path for the microwave also function as a supply passage for a reaction gas to vacuum vessel 156. As a result, there is the reaction gas to generate plasma in gap 163. Therefore, the microwave transmitted from radial line slot antenna 151 into vacuum vessel 156 can generate plasma when the gas pressure in gap 163 and the microwave conditions are inappropriate. If plasma is thus generated in gap 163, shower plate 153 and dielectric plate 152 could be damaged by this plasma. In order to prevent the plasma (abnormal plasma) from being generated in gap 163, the pressure of the reaction gas in gap 163 was set significantly higher than the pressure of the reaction gas in vacuum vessel 156. This is for the following reason: electrons in the reaction gas are accelerated by an electric field by the microwave. If however the pressure of the reaction gas in gap 163 is set to a high level of 10 Torr or more, for example, the electrons can collide with other gas atoms or molecules before they are accelerated by the above electric field. As a result, the electrons will no longer have enough energy to generate plasma, so that the plasma can be restrained from being generated in gap 163.

While the pressure of the reaction gas in gap 163 is set to a high level, the pressure inside vacuum vessel 156 must be maintained at a level of several mTorr. As a result, the pressure of the reaction gas in gap 163 is kept at a high level, while the supply of the reaction gas to vacuum vessel 156 must be sufficiently small. Therefore, the easiness for the reaction gas to flow (conductance) through the reaction gas inlets formed in shower plate 153 must be small. In order to realize such small conductance, fine gas inlets in shower plate 153 must be formed with extremely high precision (a precision in the order of 10 µm). Meanwhile, shower plate 153 must be formed using dielectric such as ceramic to allow a microwave to propagate. It is extremely difficult to form gas inlets having such high precision in the dielectric. As a result the manufacturing cost of the shower plate is disadvantageously high.

Since the pressure of the reaction gas in gap 163 must be kept at a high level, process conditions such as the component ratio or flow rate of the reaction gas can be hardly precisely controlled. As a result, the process conditions such as the gas component ratio are shifted from a prescribed numerical range, which makes it difficult to adjust the process conditions, and plasma process such as deposition can no longer performed in a prescribed condition.

In addition, as shown in FIGS. 16 and 17, the conventional radial line slot antenna 151 is circular, in order to apply it to a rectangular substrate for used in a TFT liquid crystal display device or the like, shower plate 153 larger than the rectangular substrate must be used so that the entire surface of the rectangular substrate can be covered. Such rectangular substrates have been increased in size from 500 mm×500 mm to 1 m×1 m as the liquid crystal display device has come to have a larger size. Radial line slot antenna 151 and shower plate 153 are formed using dielectric such as ceramic as described above. Since it would be difficult to form a large size dielectric plate of ceramic or the like, the conventional plasma process device cannot cope with the large size rectangular type substrate.

SUMMARY OF THE INVENTION

The present invention is directed to a solution to the above described problem, and it is an object of the present invention to provide a plasma process device capable of forming homogeneous plasma, and coping with a large area substrate less costly.

A plasma process device according to one aspect of the present invention includes a processing chamber, microwave guiding means, a shower plate, and a reaction gas supply passage. In the processing chamber, a processing using plasma is performed. The microwave guiding means guides a microwave into the processing chamber. The shower plate has a gas inlet hole to supply to the processing chamber a reaction gas attaining a plasma state by the microwave, and a lower surface facing the processing chamber and an upper surface positioned on the opposite side of the lower surface. The reaction gas supply passage is positioned on the upper surface of the shower plate to supply the reaction gas to the gas inlet hole. A wall surface of the reaction gas supply passage includes an upper surface of the shower plate and a conductor wall surface provided opposing the upper surface.

In this case, the microwave is not transmitted through the conductor. As a result, since the wall surface of the gas supply passage positioned on the upper surface of the shower plate includes the conductor wall surface, of the microwave transmitted from the microwave guiding means to the processing chamber, a component having a large electric field amplitude can be prevented from being guided into the reaction gas supply passage. As a result, formation of plasma (abnormal plasma formation) from the reaction gas in the reaction gas supply passage caused by the microwave can be prevented. Therefore, the wall surface of the reaction gas supply passage, in other words, the upper surface of the shower plate or the like can be prevented from being damaged by plasma.

Since abnormal plasma can be prevented from being generated in the reaction gas supply passage, the pressure of the reaction gas in the reaction gas supply passage can be set lower than the conventional device. Thus, the difference between the pressure of the reaction gas in the reaction gas supply passage and the pressure of the reaction gas in the processing chamber can be reduced, so that the conductance of the reaction gas in the gas inlet hole in the shower plate can be larger than the conventional case. Therefore, the size of the gas inlet hole in the shower plate can be set larger than the conventional device, so that high precision machining required by the conventional device in processing the gas inlet holes is no longer necessary. As a result, the manufacturing cost of the shower plate can be reduced.

Since the difference between the pressure of the reaction gas in the reaction gas supply passage and the pressure of the reaction gas in the processing chamber can be reduced, process conditions such as the components of the reaction gas may be more readily adjusted than the conventional device. Thus, plasma of prescribed components may be readily obtained.

In addition, since the shower plate is used to supply the reaction gas uniformly in the processing chamber, homogeneous plasma can be obtained.

A plasma process device according to another aspect of the present invention includes a processing chamber, microwave guiding means, a shower plate, and a reaction gas supply passage. In the processing chamber, a processing using plasma is performed. The microwave guiding means has an opening formed on the processing chamber to guide a microwave into the processing chamber. The shower plate is positioned between the processing chamber and the microwave guiding means and has a gas inlet hole to supply to the processing chamber a reaction gas attaining a plasma state by the microwave. The reaction gas supply passage is formed in a region other than the region under the opening of the microwave guiding means to supply the reaction gas to the gas inlet hole.

In this case, the microwave radiated from the opening of the microwave guiding means is transmitted to the shower plate, and into the processing chamber from the shower plate. Thus, the region positioned under the opening of the microwave guiding means serves as the transmission path of the microwave. The reaction gas supply passage is formed in a region other than the region under the opening of the transmission path of the microwave, so that the reaction gas supply passage and the transmission path of the microwave can be located so as not to overlap one another. Therefore, a component of the microwave having a large electric field amplitude can be surely prevented from being irradiated in the reaction gas supply passage, so that plasma caused by irradiation of the microwave upon the reaction gas can be prevented from being generated in the reaction gas supply passage. As a result, the wall surface of the reaction gas supply passage or the like can be prevented from being damaged by the plasma.

In addition, since abnormal plasma can be prevented from being generated in the reaction gas supply passage, the pressure of the reaction gas in the reaction gas supply passage can be set lower than the conventional device. Thus, the difference between the pressure of the reaction gas in the reaction gas supply passage and the pressure of the reaction gas in the processing chamber can be reduced, so that the conductance of the reaction gas in the gas inlet hole in the shower plate can be larger than the conventional case. Therefore, the size of the gas inlet hole in the shower plate can be set larger than the conventional device, so that high precision machining required by the conventional device is no longer necessary in processing the gas inlet hole. As a result, the manufacturing cost of the shower plate can be reduced.

Since the difference between the pressure of the reaction gas in the reaction gas supply passage and the pressure of the reaction gas in the processing chamber can be reduced, process conditions such as the components of the reaction gas can be adjusted more easily than the conventional device.

The use of the shower plate allows the reaction gas to be uniformly supplied in the processing chamber, so that homogeneous plasma may be obtained.

A plasma process device according to another aspect of the present invention includes a processing chamber, microwave guiding means, a shower plate, and a reaction gas supply passage. In the processing chamber, a processing using plasma is performed. The microwave guiding means guides a microwave into the processing chamber. The shower plate has a gas inlet hole to supply to the processing chamber a reaction gas attaining a plasma state by the microwave. The reaction gas supply passage is positioned on the shower plate and formed in a region other than the transmission path of the microwave guided into the processing chamber by the microwave guiding means for supplying the reaction gas to the gas inlet hole.

Thus, since the reaction gas supply passage is formed in a region other than the transmission path of the microwave, a component of the microwave having a large electric field amplitude can be prevented from being irradiated into the reaction gas supply passage. As a result, abnormal plasma caused by irradiation of the microwave upon the reaction gas can be surely prevented from being generated. Therefore, the inner wall of the reaction gas supply passage can be prevented from being damaged by the abnormal plasma.

Since the abnormal plasma can be prevented from being generated in the gas supply passage, the pressure of the reaction gas in the reaction gas supply passage can be set lower than the conventional level. As a result, the difference between the pressure of the reaction gas in the reaction gas supply passage and the pressure of the reaction gas in the processing chamber can be reduced, and the conductance of the reaction gas in the reaction gas inlet hole in the shower plate can be set larger than the conventional device. As a result, the size of gas inlet hole can be increased compared to the conventional device, and therefore high precision machining required in processing the gas inlet hole by the conventional device is no longer necessary. This allows the manufacturing cost of the shower plate to be reduced.

Since the difference between the pressure of the reaction gas in the reaction gas supply passage and the pressure of the reaction gas in the processing chamber can be reduced, process conditions such as the components of the reaction gas can be adjusted more easily than the conventional device.

Since the reaction gas can be uniformly supplied in the processing chamber using the shower plate, homogeneous plasma can be obtained.

A plasma process device according to another aspect of the present invention includes a processing chamber, microwave guiding means, a shower plate, and a reaction gas supply passage. In the processing chamber, a processing using plasma is performed. The microwave guiding means guides a microwave into the processing chamber. The shower plate has a gas inlet hole to supply to the processing chamber a reaction gas attaining a plasma state by the microwave. The reaction gas supply passage is positioned on the shower plate and isolated from the microwave guiding means by a conductor for supplying the reaction gas to the gas inlet hole.

In this case, since the microwave is not transmitted through the conductor, if the microwave guiding means and the reaction gas supply passage are isolated by the conductor, a component of the microwave from the microwave guiding means having a large electric field amplitude can be surely prevented from being irradiated upon the reaction gas supply passage. As a result, in the reaction gas supply passage, abnormal plasma caused by irradiation of the microwave upon the reaction gas in the reaction gas supply passage can be prevented from being generated. Therefore, the inner wall or the like of the reaction gas supply passage can be prevented from being damaged by this abnormal plasma.

Since abnormal plasma can be prevented from being generated in the reaction gas supply passage, the pressure of the reaction gas in the reaction gas supply passage can be set lower than the conventional device. Thus, the difference between the pressure of the reaction gas in the reaction gas supply passage and the pressure of the reaction gas in the processing chamber can be reduced, so that the conductance of the reaction gas in the gas inlet hole in the shower plate can be larger than the conventional case. Therefore, the size of the gas inlet hole in the shower plate can be set larger than the conventional device, so that high precision machining required by the conventional device in processing the gas inlet hole is no longer necessary. As a result, the manufacturing cost of the shower plate can be reduced.

Since the difference between the pressure of the reaction gas in the reaction gas supply passage and the pressure of the reaction gas in the processing chamber can be reduced, process conditions such as the components of the reaction gas can be adjusted more easily than the conventional device.

The use of the shower plate allows the reaction gas to be uniformly supplied in the processing chamber using the shower plate, so that homogeneous plasma may be obtained.

In a plasma process device according to any of the above aspects or another aspect, the shower plate may have a lower surface facing the processing chamber, and an upper surface positioned on the opposite side of the lower surface, and the wall surface of the reaction gas supply passage may include an upper surface of the shower plate and a conductor wall surface opposing the upper surface.

In this case, since the wall surface of the reaction gas supply passage includes a conductor wall surface of conductor which does not transmit the microwave, a component of the microwave having a large electric field amplitude can be surely prevented from being irradiated from the microwave guiding means to the reaction gas supply passage. As a result, abnormal plasma can be more surely prevented from being generated in the reaction gas supply passage.

In a plasma process device according to any of the above aspects or another aspect of the present invention, the gas inlet hole in the shower plate may be formed penetrating from the upper surface to lower surface of the shower plate, and the gas inlet hole at the lower surface of the shower plate may have a diameter larger than the diameter of the gas inlet hole at the upper surface of the shower plate.

In this case, a cross section of the gas inlet hole may be a shape broader from the upper surface to lower surface of the shower plate. As a result, the reaction gas to be introduced from the gas inlet hole to the processing chamber may be introduced not only in the vertical direction but also in an oblique direction with respect to the lower surface of the shower plate. As a result, the distribution of the reaction gas may be more homogeneous in the processing chamber. As a result, the plasma process can be performed in more uniform conditions.

In a plasma process device according to any of the above aspects or another aspect of the invention, the shower plate may include a plurality of shower plate portions.

In this case, small size shower plate portions may be manufactured using existing manufacturing equipment and combined to form a shower plate having a large area. As a result, a large size shower plate can be readily provided.

Such small size shower plate portions of equal quality can be more readily obtained using existing manufacturing equipment than forming a large size shower plate. As a result, a large shower plate of more equal and good quality may be obtained than forming a large shower plate as an integral form.

In the plasma process device using the shower plate of such a plurality of shower plate portions, if any of shower plate portions is damaged, only the damaged shower plate is replaced, so that the equipment can be readily and quickly repaired. As a result, time and labor required for maintenance of the plasma process device can be reduced.

In a plasma process device according to any of the above aspects or another aspect of the present invention, the isolation distance between a lower surface of the shower plate facing the processing chamber and a conductor wall surface provided opposing an upper surface positioned on the opposite side of the lower surface may be a integral multiple of half a guide wavelength of the microwave (integral multiple of half a wavelength of the microwave in microwave guide means).

Thus, cancellation of microwaves can be prevented, and more homogeneous and efficient plasma excitation can be achieved.

In a plasma process device according to any of the above aspects or another aspect of the present invention, the shower plate may include dielectric.

In this case, the microwave is transmitted through the dielectric, the microwave supplied from the microwave guiding means can be readily transmitted to the processing chamber through the shower plate.

In a plasma process device according to any of the above aspects or another aspect of the present invention, the dielectric is ceramic containing aluminum nitride as a main constituent.

In this case, since aluminum nitride has high thermal conductivity, if the shower plate is locally heated by plasma formed in the processing chamber, the locally applied heat can be quickly diffused to the entire shower plate. As a result, the shower plate can be prevented from being damaged by the local heating.

By using such a material having high thermal conductivity for the shower plate, if a high temperature portion is generated in the processing chamber, the heat of the high temperature portion can be quickly diffused to another region through the shower plate. As a result, the temperature of the processing chamber may be readily equalized.

In a plasma process device according to any of the above aspects or another aspect of the present invention, a vessel member, a pedestal, and a shower plate securing member may be provided. The vessel member may form a processing chamber, and the pedestal may be secured to the vessel member. The shower plate securing member may secure the shower plate by pressing the shower plate to the pedestal.

In this case, if a screw is used for securing the shower plate to the pedestal, a screw hole to receive the screw must be formed in the shower plate of dielectric. The processing using the screw increases the manufacturing cost of the shower plate. In the plasma process device according to the present invention, however, the shower plate is secured to the pedestal by pressing the shower plate to the pedestal, and therefore no screw hole is necessary. As a result, the manufacturing cost of the shower plate may be reduced.

In a plasma process device according to any of the above aspects or another aspect of the present invention, flow rate control means for controlling the flow rate of the reaction gas in the gas inlet hole in the shower plate may be provided.

In this case, the flow rate of the reaction gas supplied to the processing chamber may be adjusted by the flow rate control means, and therefore the plasma process condition in the processing chamber may be readily optimized.

In a plasma process device according to any of the above aspects or another aspect of the present invention, the flow rate control means may include a plug to be inserted into the gas inlet hole in the shower plate.

In this case, the conductance of the reaction gas in the gas inlet hole in the shower plate can be changed by changing the diameter of the plug as the inner diameter of the gas inlet hole is fixed. More specifically, as the gas inlet hole in the shower plate, a hole of a prescribed size is formed. Then, the diameter of the plug is determined to form a gap to serve as a gas passage for the reaction gas between the inner wall of the gas inlet hole and the sidewall of the plug. Thus, the gas inlet hole in the shower plate may be readily machined and at the same time the conductance of the reaction gas in the gas inlet hole in the shower plate may be changed by changing the plug. As a result, the cost of the shower plate may be reduced and processing conditions such as the flow rate of the reaction gas may be readily changed.

In a plasma process device according to any of the above aspects or another aspect of the present invention, the shower plate has a substantially rectangular shape when viewed from the top.

In this case, the plasma process device suitable for processing such as deposition and etching by CVAD to a rectangular glass substrate used for a liquid crystal device may be obtained.

In a plasma process device according to any of the above aspects or another aspect of the invention, the microwave guiding means may include a single mode microwave waveguide.

In this case, the microwave can be readily controlled and a stable and homogeneous microwave can be transmitted to the processing chamber.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
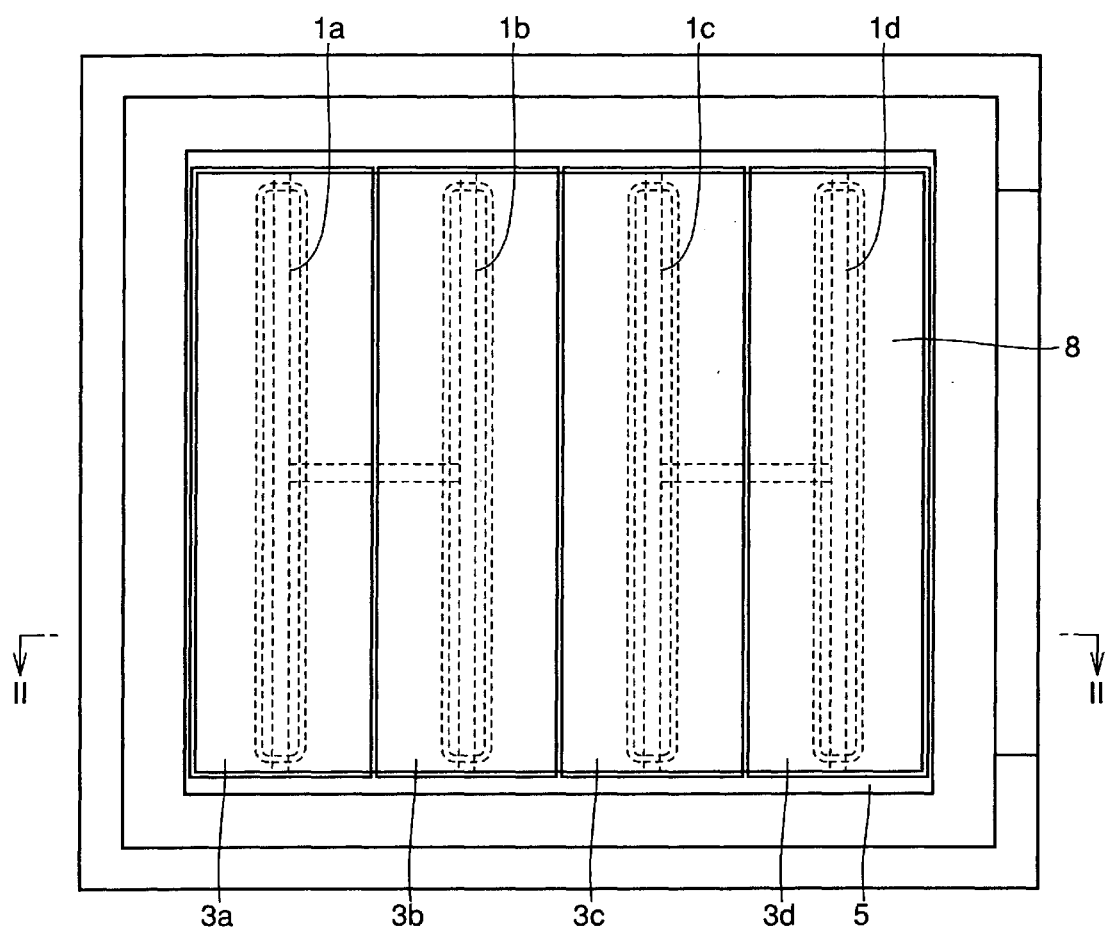
FIG. 1 is a schematic plan view of a plasma process device according to a first embodiment of the present invention.

Embodiments of the present invention will be described in conjunction with the accompanying drawings, in which the same or corresponding portions are denoted with the same reference characters and the description is not provided.

First Embodiment

Referring to FIG. 1, a plasma process device will be described.

Referring to FIG. 1, the plasma process device includes four waveguides 1a to 1d as microwave guiding means to transmit microwaves, and shower plates 3a to 3d. Waveguides 1a to 1d and shower plates 3a to 3d are provided on the upper lid of a vacuum vessel as a vessel member to form a processing chamber as shown in FIG. 2.

Figure 2:
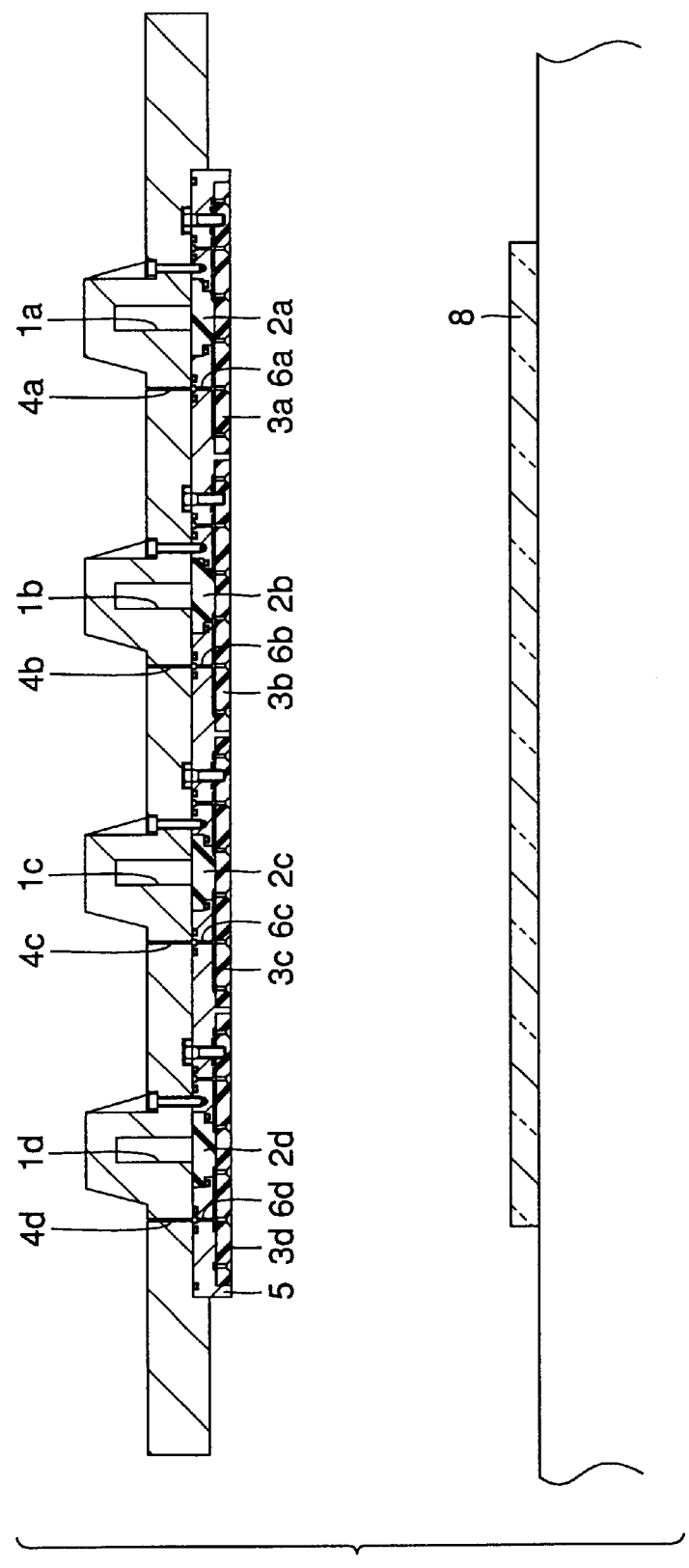
FIG. 2 is a schematic cross sectional view taken along line II—II in FIG. 1.

Referring to FIG. 2, under waveguides 1a to 1d, first dielectric plates 2a to 2d serving as a microwave guiding window are formed. First dielectric plates 2a to 2d are provided to fill a shower plate holder 5 for holding shower plates 3a to 3d. Shower plate holder 5 is formed of conductor such as metal. Shower plates 3a to 3d are formed at the lower surface of shower plate holder 5. Shower plates 3a to 3d are provided to have their upper surfaces in contact with first dielectric plates 2a to 2d, respectively. Shower plates 3a to 3d have gas inlet holes 18 (see FIG. 3). Gas inlet holes 18 are connected to gas inlet passages (paths) 4a to 4d, and 6a to 6d. A substrate 8 is provided on a substrate holder so as to be under shower plates 3a to 3d. Substrate 8 is a glass substrate for a liquid crystal display, and has a large size about in the range from 500 mm×500 mm to 1 m×1 m.

Figure 3:
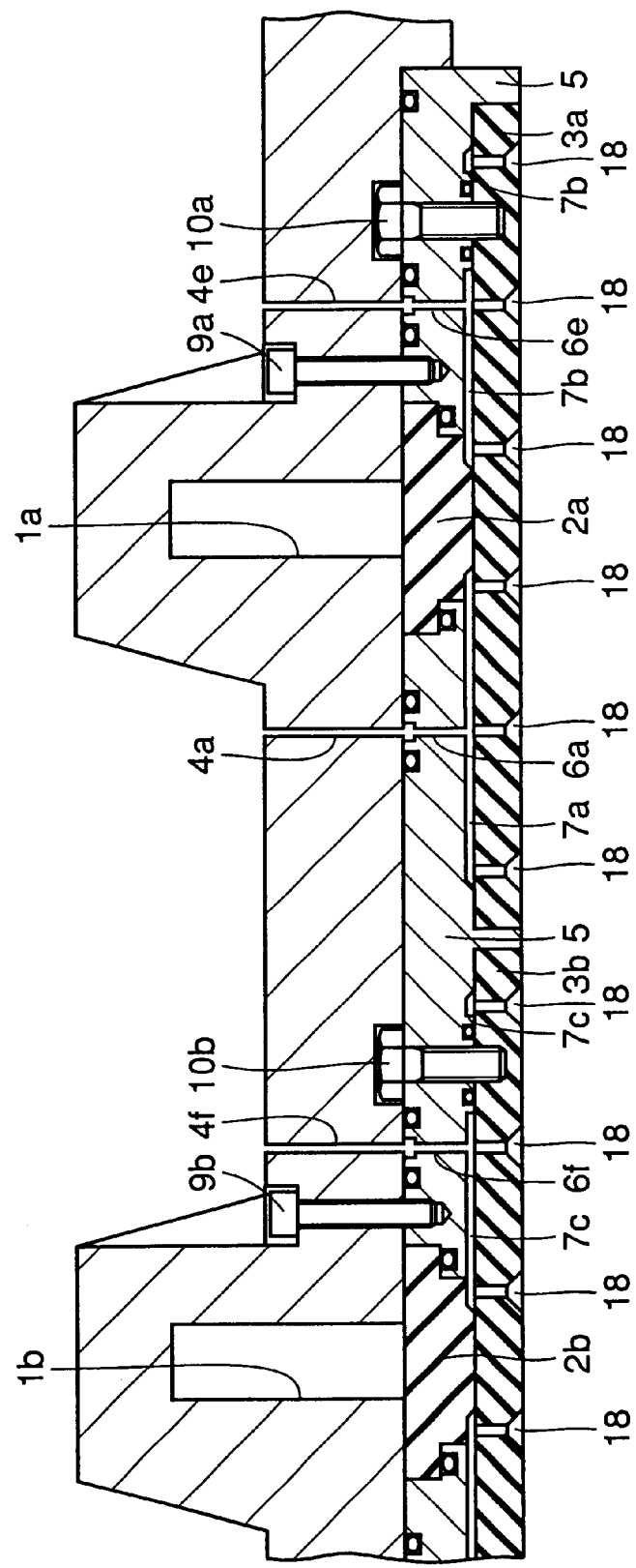
FIG. 3 is a schematic enlarged cross sectional view of a part of the upper lid of a vacuum vessel in the plasma process device shown in FIG. 2.

Referring to FIG. 3, the structure of the shower plate portion of the plasma process device according to the present invention will be described in detail.

Referring to FIG. 3, a shower plate holder 5 is secured with securing bolts 9a, 9b on the upper lid of the vacuum vessel having waveguides 1a, 1b. Shower plates 3a, 3b are secured to this shower plate holder 5 using securing bolts 10a, 10b. Gas inlet paths 4a to 4d (see FIG. 2) are formed on the upper lid of the vacuum vessel. Gas inlet path 4a formed on the upper lid of the vacuum vessel is connected to a gas inlet gap portion 7a as a reaction gas supply passage through a gas inlet path 6a formed at shower plate holder 5. Gas inlet gap portion 7a includes an upper surface of shower plate 3a and a lower surface of shower plate holder 5 as a conductor wall surface at its wall surface. Gas inlet gap portion 7a is connected to gas inlet holes 18 formed at shower plate 3a. A reaction gas supplied from gas inlet path 4a reaches gas inlet gap portion 7a through gas inlet path 6a. The reaction gas is then let through gas inlet holes 18 from gas inlet gap portion 7a into the processing chamber to form plasma such that the reaction gas is uniformly distributed. Note that the other gas inlet paths 4e, 4f, 6e, 6f and gas inlet gap portions 7b, 7c as shown have the same structures as described above.

First dielectric plates 2a, 2b are provided under waveguides 1a, 1b as described above. Shower plates 3a, 3b are provided under first dielectric plates 2a, 2b. A microwave is transmitted from waveguides 1a, 1b to shower plates 3a, 3b through first dielectric plates 2a, 2b. In this case, first dielectric plates 2a, 2b are preferably made of $Al_2O_3$ which transmits a microwave in a high transmittance, and is easily machinable and available. The microwave transmitted to shower plates 3a, 3b through first dielectric plates 2a, 2b is irradiated upon the inside of the processing chamber from the region under dielectric plates 2a, 2b and plasma is generated at the lower surface of shower plates 3a, 3b. Since the microwave cannot be propagated deeply inside the plasma, excess microwave components propagate transversely through shower plates 3a, 3b. As a result, the microwave will be irradiated to the inside of the processing chamber from the entire lower surfaces of shower plates 3a, 3b. The thus irradiated microwave excites the reaction gas introduced into the processing chamber from gas inlet hole 18, which results in plasma substantially uniformly distributed over the entire surface of substrate 8 (see FIG. 2). Using this plasma, a processing such as deposition, etching and ashing may be performed on substrate 8.

Here, the conductor such as metal forming shower plate holder 5 does not transmit the microwave. As described above, gas inlet gap portion 7a includes an upper surface of shower plate 3a and a lower surface of shower plate holder 5 at its sidewall as described above, of the microwave transmitted from waveguide 1a as the microwave guiding means to the processing chamber, a component having a large electric field amplitude can be prevented from being guided into gas inlet gap portion 7a. As a result, generation of plasma from the reaction gas caused by the microwave in gas inlet gap portion 7a (abnormal plasma generation) can be prevented Thus, the wall surface of gas inlet gap portion 7a, in other words, the upper surface of shower plate 3a or the like can be prevented from being damaged by the plasma.

Furthermore, since the abnormal plasma can be prevented from being generated in gas inlet gap 7a, the pressure of the reaction gas in gas inlet gap portion 7a can be set at a lower level than the conventional level. As a result, the difference between the pressure of the reaction gas in gas inlet gap portion 7a and the pressure of the reaction gas in the processing chamber can be reduced, then the conductance of the reaction gas in gas inlet hole 18 in shower plate 3a can be larger than the conventional device. As a result, the size of gas inlet hole 18 in shower plate 3a can be increased compared to the conventional device, and therefore high precision machining required by the conventional device in processing gas inlet hole 18 is no longer necessary. This allows the manufacturing cost of shower plate 3a to be reduced.

Since the difference between the pressure of the reaction gas in gas inlet gap portion 7a and the pressure of the reaction gas in the processing chamber can be reduced, process conditions such as the components of the reaction gas can be adjusted more easily than the conventional device. The use of the shower plates allows the reaction gas to be uniformly supplied in the processing chamber, so that homogeneous plasma may be obtained.

Also as described above, a shower plate having a large area can be readily formed using shower plates 3a to 3d as the shower plate portion. As a result, a large size substrate can be readily constructed.

The region positioned under the opening portion of waveguides 1a to 1d as the microwave guiding means serves as a transmission path for the microwave, and gas inlet gap portions 7a to 7c are formed on the upper surfaces of shower plates 3a, 3b in a region other than the region positioned under the opening portion under these waveguides 1a, 1b.

In this case, the transmission path for the microwave and gas inlet gap portions 7a to 7c can be located so as not to overlap one another. As a result, a component of the microwave having a large electric field amplitude can be prevented from being irradiated upon gas inlet gap portions 7a to 7c, so that generation of plasma in gas inlet gap portions 7a to 7c caused by the irradiation of the microwave upon the reaction gas can be prevented. As a result, the wall surface or the like of gas inlet gap portions 7a to 7c can be prevented from being damaged by such plasma, while the manufacturing cost of shower plates 3a to 3d can be reduced as well, and a large size substrate can be readily coped with.

As described above, in the transmission path from waveguides 1a through first dielectric plates 2a to 2d and shower plates 3a to 3d, the microwave is transmitted into the processing chamber from waveguides 1a to 1d (see FIG. 2). Gas inlet gap portion 7a to 7c are formed in a region other than the transmission path on shower plates 3a, 3b.

Therefore, the microwave can be prevented from being irradiated upon gas inlet gap portions 7a to 7c, so that the wall surface or the like can be prevented from being damaged by the plasma, while the manufacturing cost of shower plates 3a to 3d can be reduced as described above, and a large size substrate can be readily coped with.

In the plasma process device according to the present invention, gas inlet gap portions 7a to 7c are isolated from waveguides 1a, 1b as the microwave guiding means by shower plate holder 5 as conductor.

Thus, of the microwave let into the processing chamber from waveguides 1a, 1b, a component having a large electric field amplitude can be prevented from being irradiated upon gas inlet gap portions 7a to 7c. As a result, the wall surface or the like of gas inlet gap portions 7a to 7c can be prevented from being damaged by the plasma, while the manufacturing cost of shower plates 3a to 3d can be reduced as described above, and a large size substrate can be readily coped with.

The shower plate is formed by combining a plurality of small size shower plates 3a to 3d, and such small size shower plates 3a to 3d can be formed using existing equipment. As a result, the manufacturing cost of the shower plates can be further reduced.

When a large size shower plate corresponding to a large size substrate is formed in an integral form, a large size heating furnace corresponding to the size of such a shower plate must be used. In such large equipment, however, the distribution of the heating temperature for the shower plate can be hardly uniformly maintained. As a result, the quality of manufactured shower plates can be hardly equal. According to the present invention, however, since relatively small size shower plates 3a to 3d are used, such a problem can be avoided.

Since small size, separate shower plates such as shower plates 3a to 3d are used, if any of shower plates 3a to 3d is damaged, the damaged shower plate has only to be replaced. As a result, the maintenance and examination operation for the plasma process device can be more readily performed than the case of using an integral type shower plate.

In this case, shower plates 3a to 3d are preferably formed of aluminum nitride (AlN). Since aluminum nitride has high thermal conductivity, if shower plates 3a to 3d are locally heated, the locally applied heat can be quickly diffused to other part. Therefore, shower plates 3a to 3d can be prevented from being damaged by such local heat. The use of a material with high thermal conductivity for shower plates 3a to 3d permits the temperature of the processing chamber to be made homogeneous over the entire surface of substrate 8. As a result, the plasma process conditions can be more equalized over the entire surface of substrate 8.

The two-dimensional configuration of the shower plate portion formed by shower plates 3a to 3d is rectangular as shown in FIG. 1, the plasma process device according to the present invention can be readily applied to a rectangular glass substrate used for example for a liquid crystal display.

The use of a single mode microwave waveguide as waveguides 1a to 1d permits a microwave to be readily controlled and a stable and homogeneous microwave can be transmitted into the processing chamber.

Gas inlet hole 18 has a substantially circular cross section in the horizontal direction and is formed such that the diameter of gas inlet hole 18 at the lower surface of shower plates 3a to 3d is larger than the diameter of gas inlet hole 18 at the upper surface of shower plates 3a to 3d. Therefore, the reaction gas introduced from gas inlet 18 into the reaction chamber is introduced not only in the direction substantially vertical to the lower surface of shower plates 3a to 3d but also in a direction oblique to the lower surface. Thus, if for example the plasma process device shown in FIG. 1 is used for plasma CVD, the quality and thickness of a CVD film formed on the surface of substrate 8 can be more equalized over the entire surface of substrate 8.

Note that shower plate holder 5 is an integral metallic holder herein, but the shower plate holder itself may be divided into four parts corresponding to shower plates 3a to 3d. When shower plate holder 5 itself is divided, attachment between shower plates 3a to 3d and shower plate holder 5, the attachment state between shower plates 3a to 3d and shower plate holder 5 or the state of gas inlet gap portions 7a to 7c may be examined as they are removed from the plasma process device (in an off line state). As a result, the plasma process device can be maintained/examined with reduced time and labor.

Second Embodiment

Figure 4:
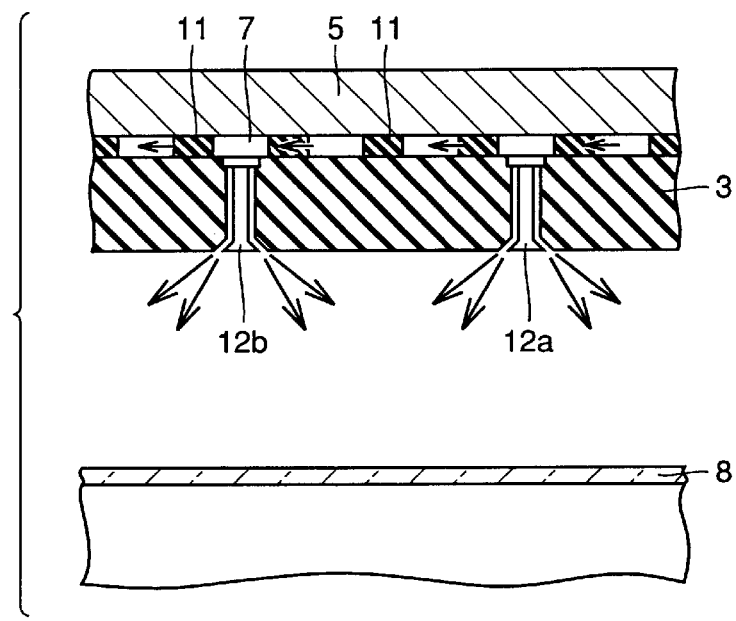
FIG. 4 is a schematic cross sectional view of a shower plate in a plasma process device according to a second embodiment of the present invention.

Referring to FIG. 4, the shower plate will be described.

Referring to FIG. 4, core members 12a, 12b which are plugs as flow rate control means are provided at the gas inlet hole of shower plate 3. A spacer 11 to keep the height of gas inlet gap portion 7 at a prescribed level is provided at an upper surface of shower plate 3. The structure of core member 12a provided at the gas inlet hole will be described in conjunction with FIG. 5.

Figure 5:
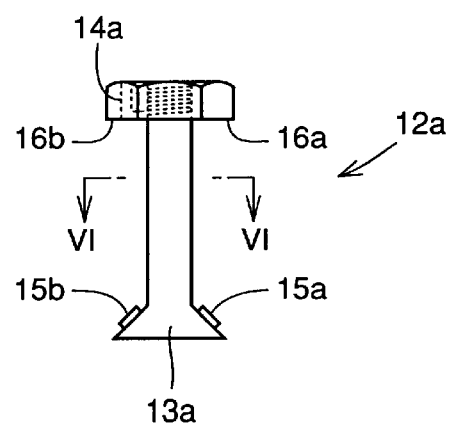
FIG. 5 is a schematic side view of the core member shown in FIG. 4.

Referring to FIG. 5, core member 12a includes a rod portion 13a and a nut portion 14a. Rod portion 13a and nut portion 14a can be isolated, and the upper part of rod portion 13a serves as a male screw and nut portion 14a serves as a female screw. After rod portion 14a is inserted into the gas inlet of shower plate 3, nut portion 14a is engaged into the upper part of rod portion 13a from the upper surface of shower plate 3, and thus core member 12a can be secured to the gas inlet hole of shower plate 3. At this time, core member 12a is in contact with shower plate 3 at rod abutment portions 15a, 15b and nut abutment portions 16a, 16b. Note that grooves to serve as a passage for a reaction gas are formed at the surface of shower plate 3 which nut abutment portions 16a, 16b or nut abutment portions 16a, 16b are in contact with.

The use of these core members 12a, 12b permits the conductance of the reaction gas in the gas inlet hole to be readily controlled by adjusting the size of rod abutment portions 15a, 15b and nub abutment portions 16a, 16b.

Also, the use of such core members 12a, 12b permits maintenance operations such as cleaning of clogging in the gas inlet holes to be readily performed after these core members 12a and 12b are removed. As a result, time and labor required for maintenance of shower plate 3 can be reduced.

Figure 6:
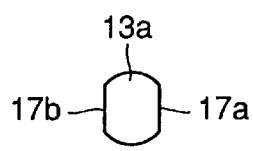
FIG. 6 is a schematic cross sectional view taken along line VI—VI in FIG. 5.

As shown in FIG. 6, notch surfaces 17a, 17b may be formed on the side surface of rod portion 13a. Such notch surfaces 17a, 17b permits the conductance of the reaction gas in the gas inlet hole to be readily changed by changing the notch depth of notch surfaces 17a, 17b.

If the diameters of the gas inlet holes of shower plates 3 are set equal, and a plurality of core members 12a, 12b are prepared, the conductance of the reaction gas in the gas inlet holes in shower plate 3 can be readily changed by replacing core members 12a, 12b. As a result, the manufacturing cost of the plasma process device can be lower than the case of prepaling a plurality of shower plates 3 having different diameters for the gas inlet holes.

Furthermore, as compared to the case of forming a gas inlet hole having a small diameter to obtain necessary conductance, the use of the gas inlet hole having a size large enough to insert core members 12a, 12b can reduce the manufacturing cost of the shower plate because fine machining is not necessary.

Third Embodiment

Figure 7:
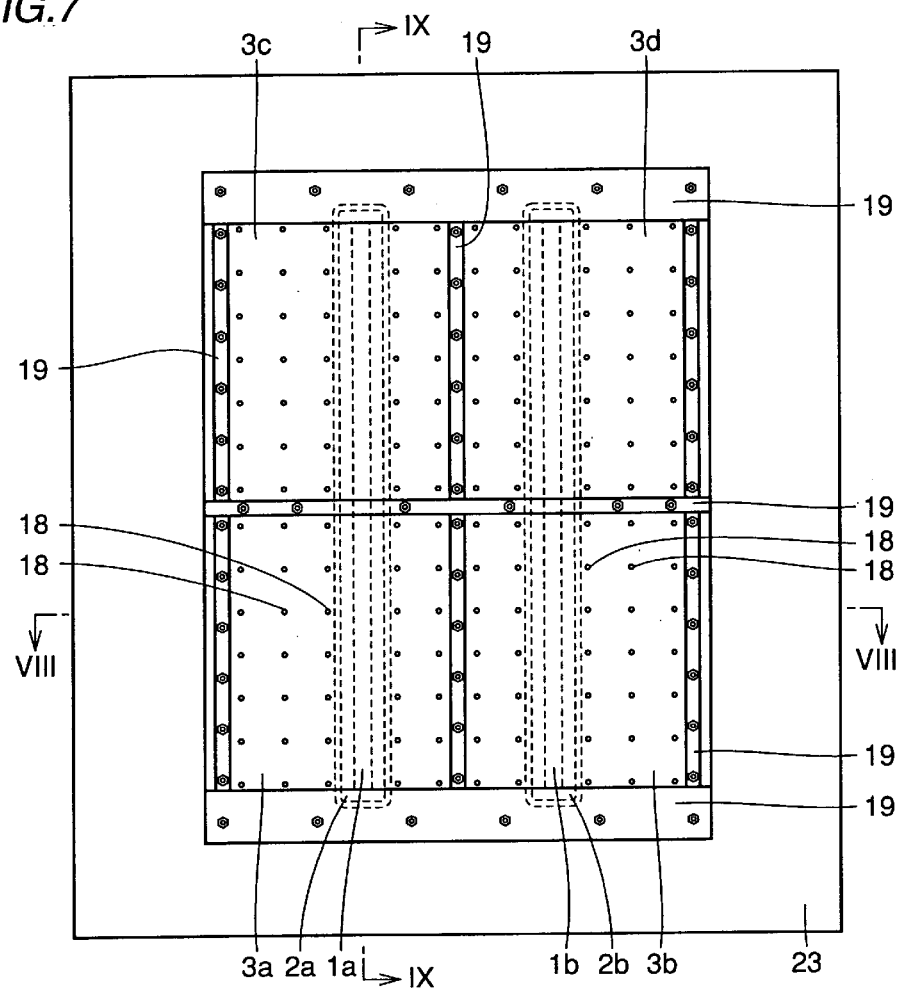
FIG. 7 is a schematic plan view of a plasma process device according to a third embodiment of the present invention.

FIG. 7 is a schematic plan view of a plasma process device according to the present invention showing the bottom surface of shower plates 3a to 3d as viewed from the bottom side of the shower plate. Referring to FIG. 7, the plasma process device will be described.

Referring to FIG. 7, the four divisional shower plates 3a to 3d are provided on the upper lid 23 of the vacuum vessel as the vessel member for the plasma process device. Shower plates 3a to 3d have gas inlet holes 18 to supply a reaction gas into the processing chamber. At the outer peripheral portion of shower plates 3a to 3d, there is a shower plate securing member 19 to secure these shower plates 3a to 3d to shower plate holder 5 (see FIG. 8) as a pedestal. A cross sectional structure of the plasma process device will be described in conjunction with FIG. 8.

Figure 8:
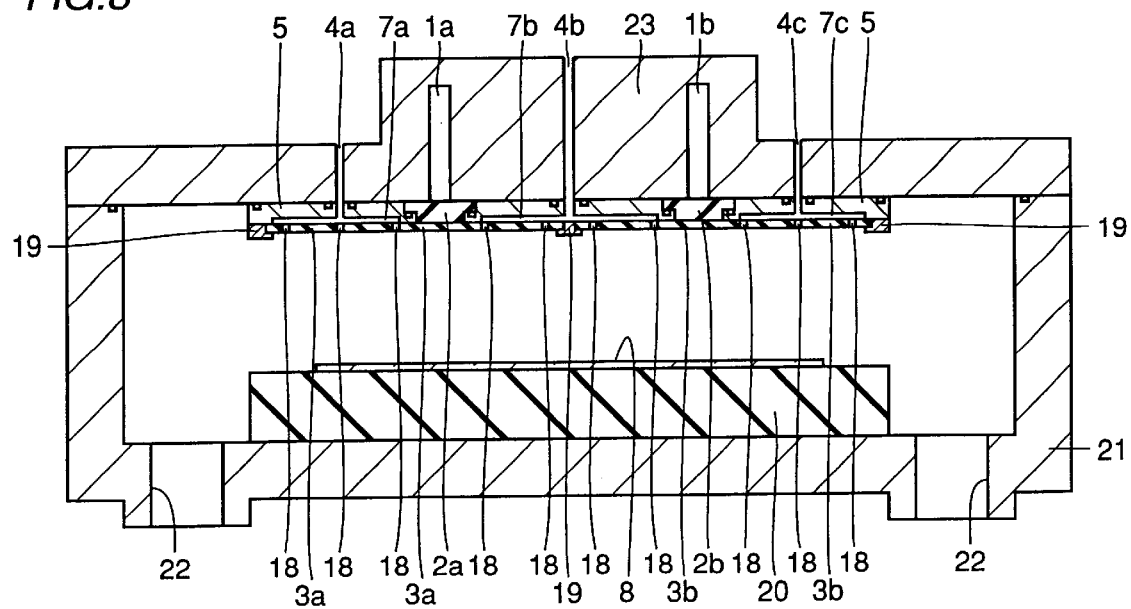
FIG. 8 is a schematic cross sectional view taken along line VIII—VIII in FIG. 7.

Referring to FIG. 8, a substrate 8 is provided on a substrate holder 20 in a vacuum vessel 21 as a processing chamber. Exhaust holes 22 are formed at the bottom of vacuum vessel 21. Exhaust holes 22 are connected to an exhaust pump 25 (see FIG. 14) to let out the part of a reaction gas which has not contributed to the plasma process and a gas generated by plasma process.

Note however that in the plasma process device as shown in FIGS. 7 and 8, shower plates 3a to 3d are secured to shower plate holder 5 using a shower plate securing member 19. Shower plate securing member 19 has a support portion extending to the lower surface of shower plates 3a to 3d at the outer periphery of shower plates 3a to 3d. Shower plates 3a to 3d are supported by the support portion. Shower plate securing member 19 is secured to shower plate holder 5 with a screw or the like. Shower plate securing member 19 presses the outer peripheral portion of shower plates 3a to 3d to shower plate holder 5 by the support portion, so that shower plates 3a to 3d are secured to shower plate holder 5. The other structure is the same as that of the plasma process device according to the first embodiment of the present invention as shown in FIGS. 1 to 3.

Thus, the process of forming grooves for screws to shower plates 3a to 3d is not necessary. As a result, the manufacturing cost of shower plates 3a to 3d may be reduced.

In the plasma process device shown in FIG. 8, gas inlet holes 18 in shower plates 3a to 3d are formed in the region other than under first dielectric plates 2a, 2b. As a result, gas inlet gap portions 7a to 7c may be surely formed in the region other than the plasma transmission path, so that abnormal plasma can be surely prevented from being generated in gas inlet gap portions 7a to 7c.

Figure 9:
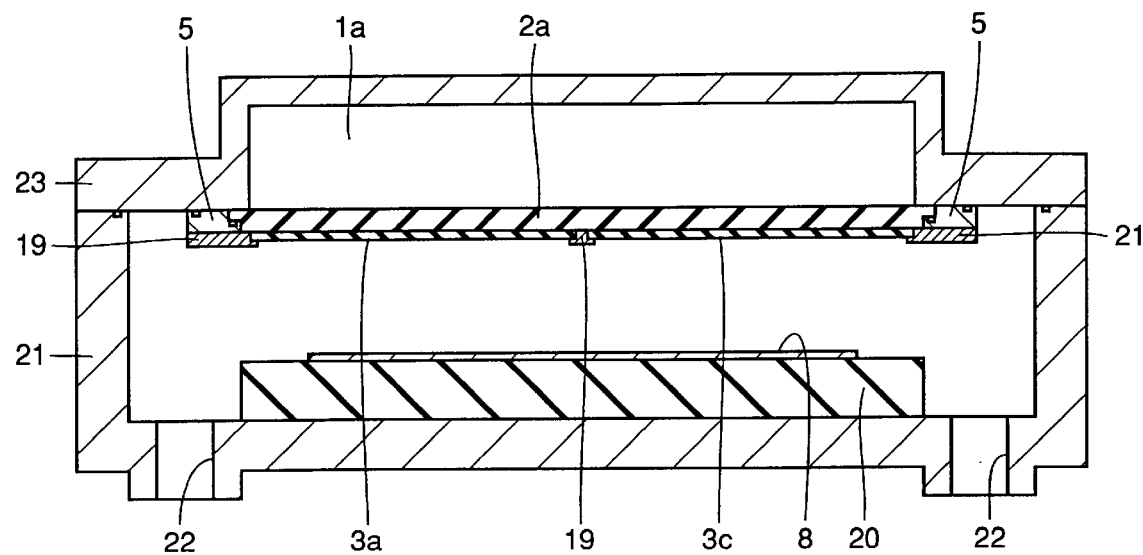
FIG. 9 is a schematic cross sectional view taken along line IX—IX in FIG. 7.

As can be seen from FIG. 9, first dielectric plate 2a is formed to extend along the direction in which waveguide 1a extends. As shown, shower plate 3c is secured to shower plate holder 5 using shower plate securing member 19 similarly to shower plates 3a and 3b.

Figure 10:
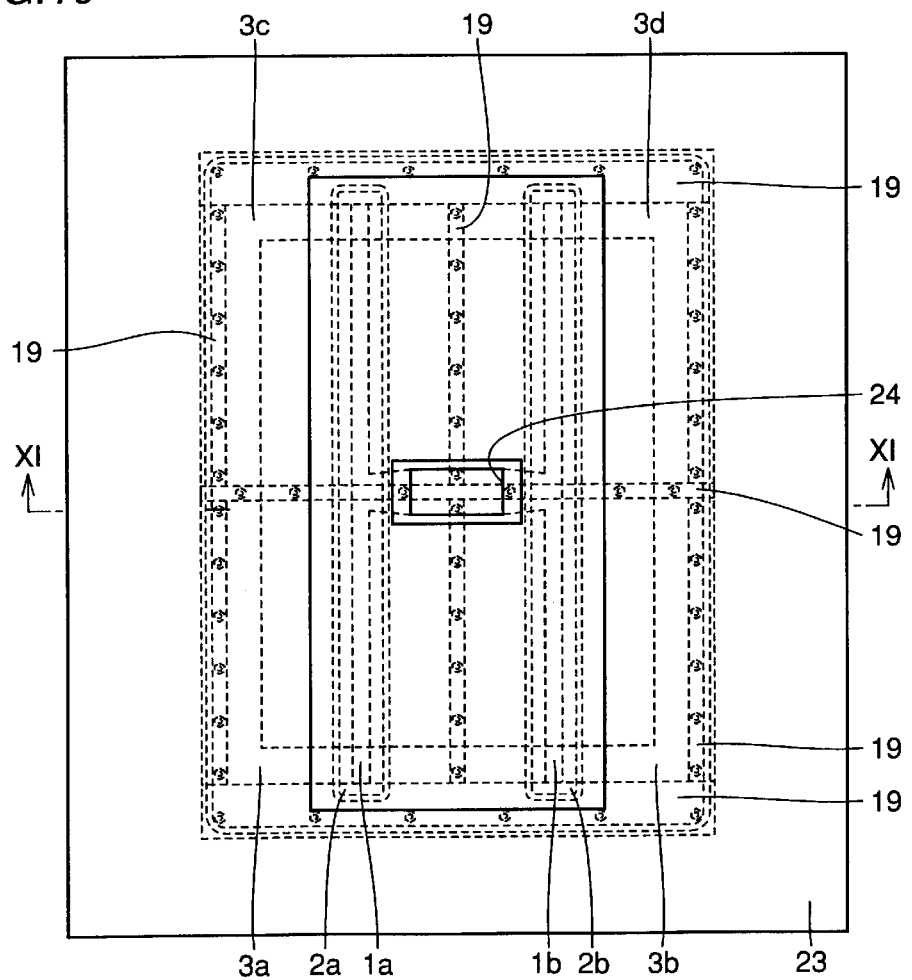
FIG. 10 is a schematic top plan view of the plasma process device according to the present invention shown in FIG. 7 seen from the top of the lid of the vacuum vessel.
Figure 11:
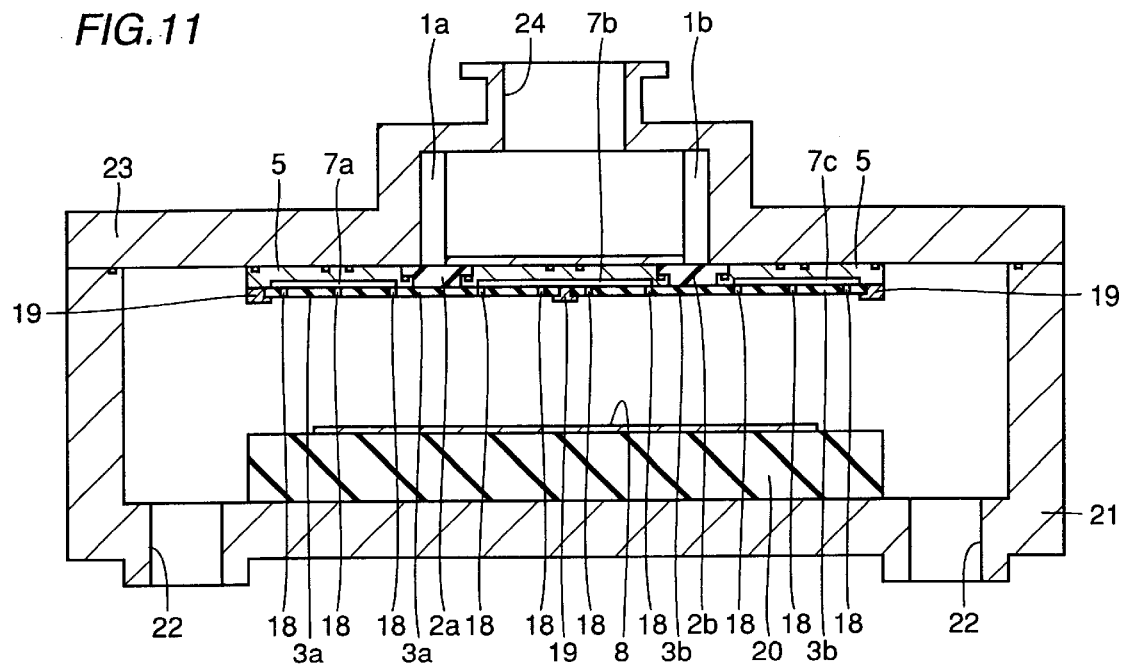
FIG. 11 is a schematic cross sectional view taken along line XI—XI in FIG. 10.

Referring to FIGS. 10 and 11, a microwave is supplied from waveguides 1a, 1b from a waveguide 24. More specifically, the microwave introduced from the upper part of the surface of the sheet to waveguide 24 in FIG. 10 branch to the left and right toward waveguides 1a and 1b as shown in FIG. 10, and are then supplied from the central portions of waveguides 1a and 1b to their end portions.

Fourth Embodiment

Figure 12:
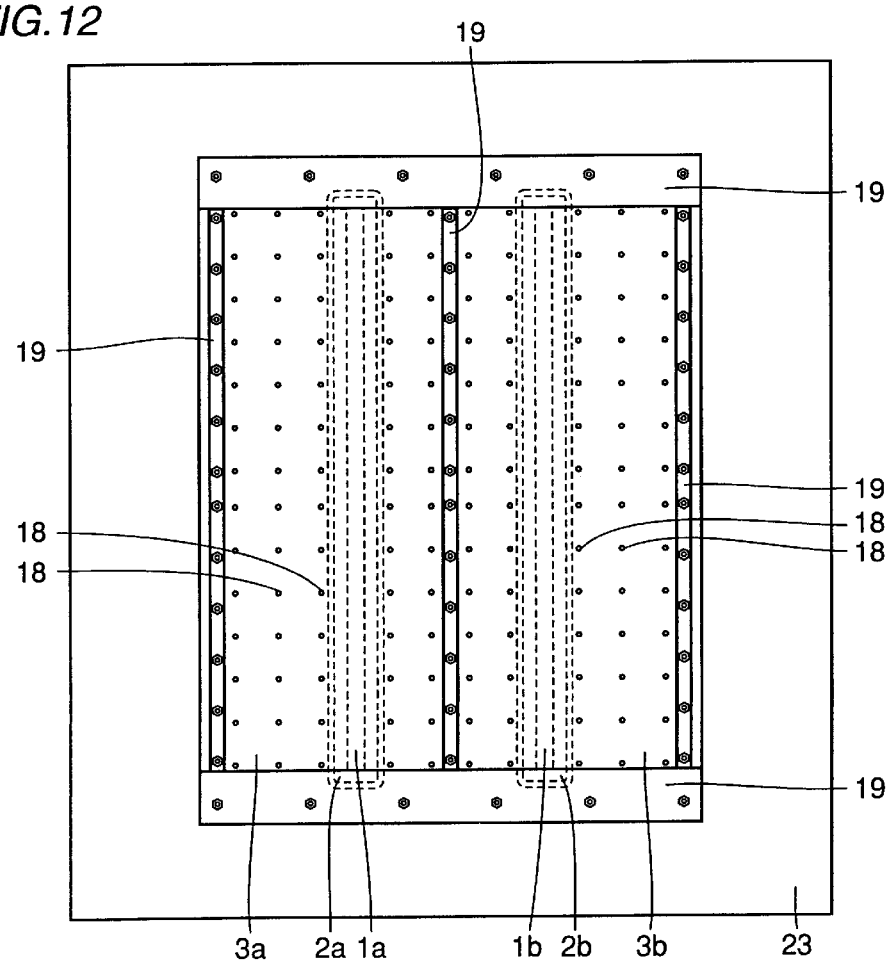
FIG. 12 is a schematic plan view of a plasma process device according to a fourth embodiment of the present invention.

FIG. 12 is a schematic plan view of a plasma process device showing the upper lid of the vacuum vessel as viewed from the lower surface of the shower plate of the plasma process device similarly to FIG. 7.

Referring to FIG. 12, the plasma process device has basically the same structure as the plasma process device as shown in FIG. 7 except that the shower plate portion is divided into two shower plates 3a, 3b. Also in this case, the same effect as that of the plasma process device according to the third embodiment of the present invention may be provided.

Fifth Embodiment

Figure 13:
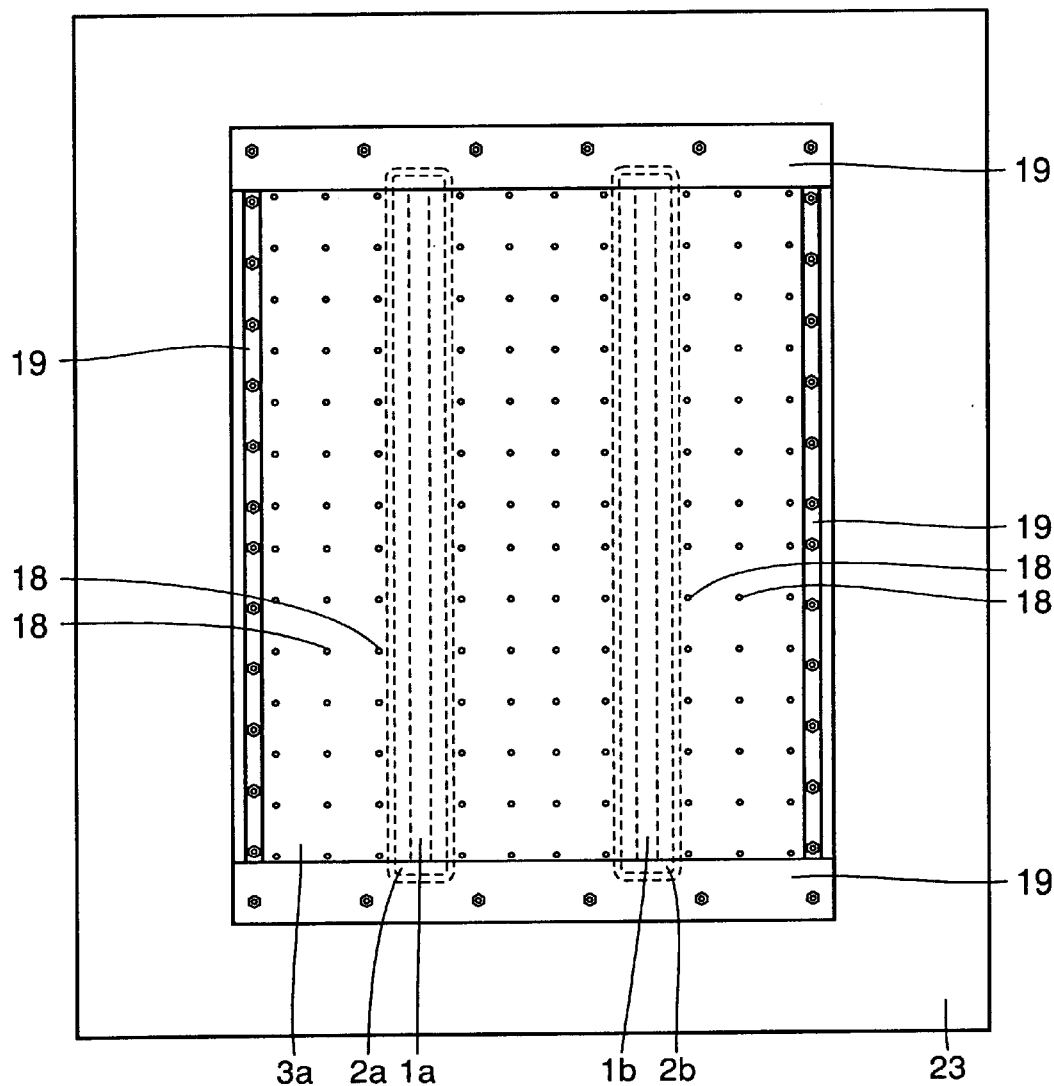
FIG. 13 is a plan view of a plasma process device according to a fifth embodiment of the present invention.

FIG. 13 is a schematic plan view of a plasma process device showing the upper lid of a vacuum vessel viewed from the lower surface of the shower plate of the plasma process device similarly to FIG. 12.

Referring to FIG. 13, the plasma process device basically has the same structure as that shown in FIG. 7 except that in the plasma process device shown in FIG. 13, an integral type shower plate 3a is used as a shower plate. In this case, the number of shower plate securing members 19 may be smaller than the case of using a separate type shower plate portion. As a result, the process of mounting shower plate 3a to shower plate holder 5 may be simplified.

Note that the structure of the upper lid 23 of the vacuum vessel from shower plate 3a to waveguides 1a, 1b is basically the same as the plasma process device shown in FIG. 7. Thus, similarly to the first embodiment, abnormal plasma may be prevented from being generated in a gas inlet gap portion positioned on shower plate 3a. As a result, the difference between the pressure of a reaction gas in the gas inlet gap portion and the pressure of the reaction gas in a processing chamber may be reduced, so that the size of gas inlet holes 18 in shower plate 3a may be larger than the conventional device. Therefore, the process of forming gas inlet holes 18 does not require high precision processing as required by the conventional device, which reduces the manufacturing cost of shower plate 3a. Furthermore, similarly to the first embodiment, process conditions such as the composition of the reaction gas may be more readily adjusted than the conventional device.

Sixth Embodiment

Regarding a device according to a sixth embodiment of the present invention, a schematic plan view thereof and a part of the structure are basically the same as those of the first embodiment.

Figure 14:
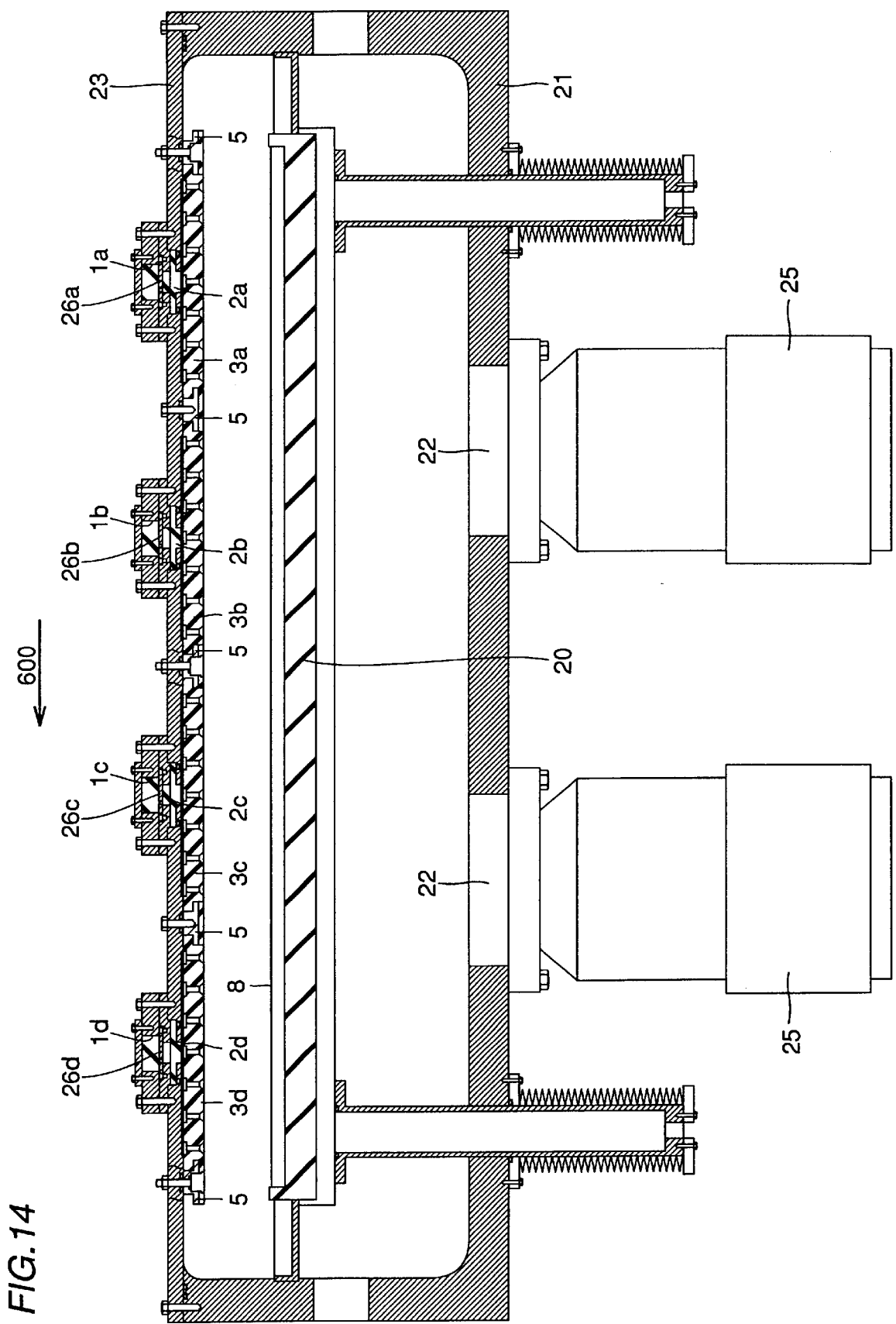
FIG. 14 is a schematic cross sectional view of a plasma process device according to a sixth embodiment of the present invention.
Figure 15:
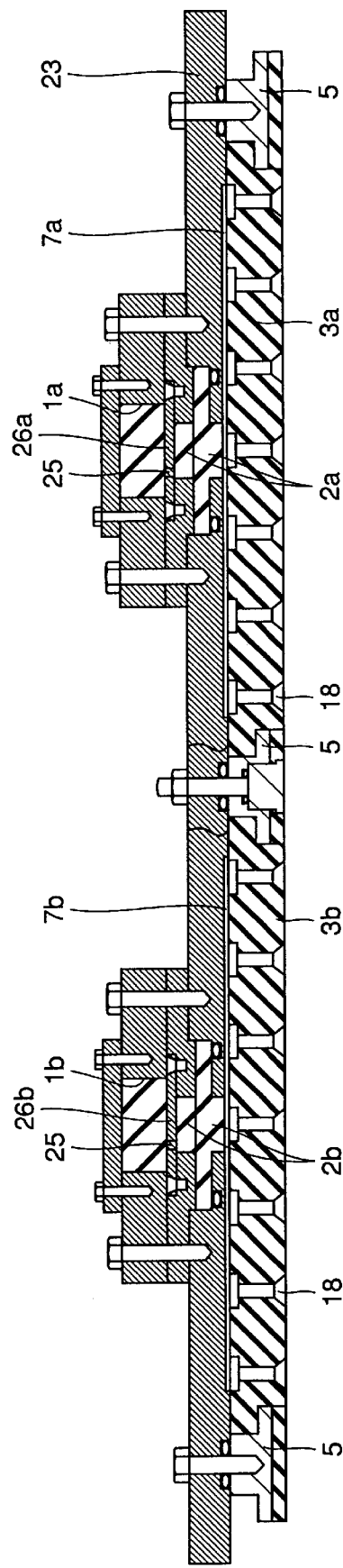
FIG. 15 is a schematic enlarged cross sectional view of the vicinity of a slot plate in FIG. 14.
Figure 16:
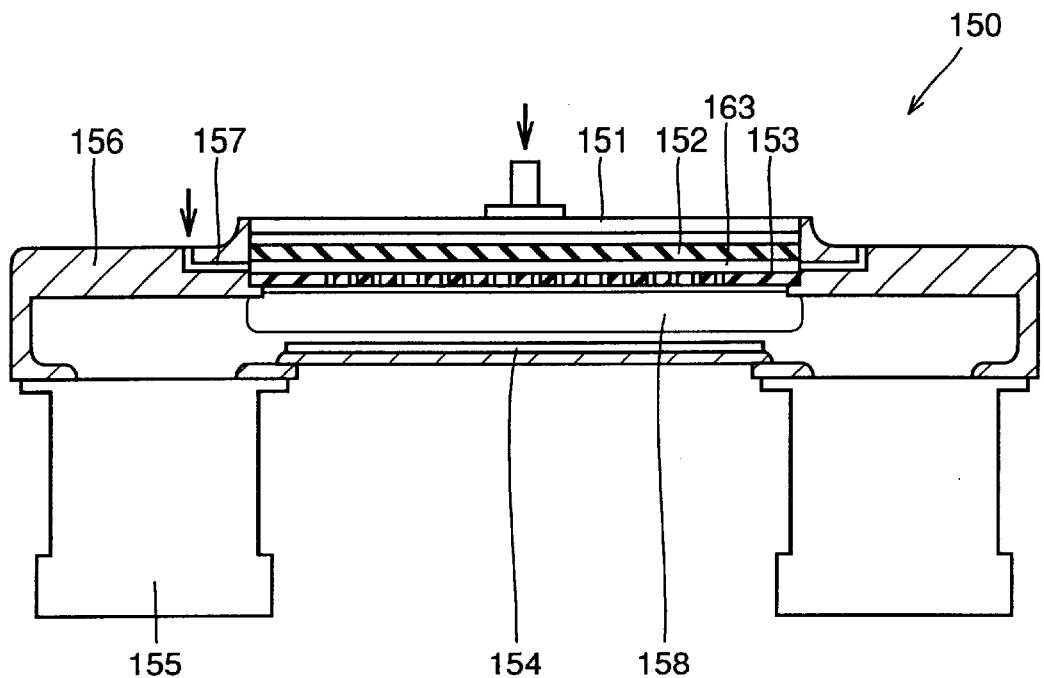
FIG. 16 is a schematic cross sectional view of a conventional plasma process device.
Figure 17:
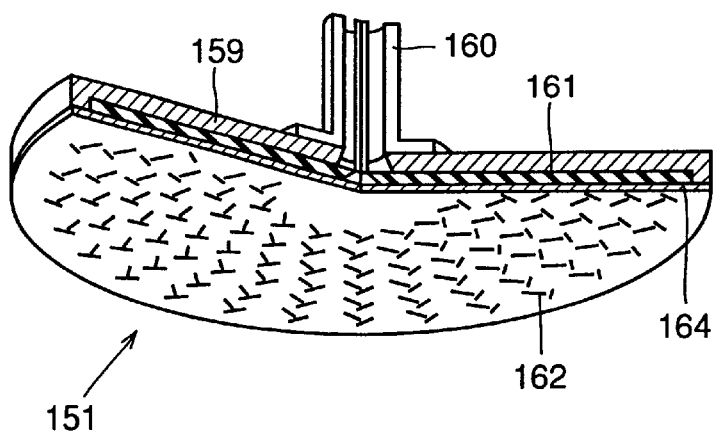
FIG. 17 is a schematic perspective view of a radial line slot antenna shown in FIG. 16.

Referring to FIGS. 14 and 15, the device guides a microwave into a processing chamber using a single mode waveguide similarly to the first embodiment, but an H-plane slot antenna is used for the inlet portion.

The H-plane slot antenna refers to an antenna having slots at longer side ends in a cross section of the waveguide and irradiating microwaves from the slots. The distribution of electromagnetic fields in the longer side direction (in the direction parallel to the H-plane) of the single mode waveguide is dissymmetrical (1) with respect to a plane through the center of the longer side (a plane perpendicular to the longer side and parallel to the shorter side), and is inverted (2) for every half a wavelength in the propagating direction of the electromagnetic fields (relative to the guide wavelength in the waveguide, which will be omitted in the following description). As a result, if slots are formed alternately on the light and left with respect to the center of the longer side in the propagating direction of the electromagnetic fields, the phases of the microwaves radiated from the slots can be all in phase by the combined effect of (1) and (2).

Normally, a microwave radiated from a waveguide is inverted for every half a wavelength, and therefore there formed a space to cancel microwaves with one another for every half a wavelength. However, the use of the H-plane antenna permits the radiation from all the slots to be in phase, and such cancellation of microwaves will not be caused. More specifically, more homogeneous and efficient plasma excitation is enabled.

More specifically, slot plates 26a to 26d are formed under the longer sides of waveguides 1a to 1d. Note that in the cross section shown, slots 25 are mainly provided in the downward direction on the surface of the sheet (in the direction of arrow 600), in a cross section taken at a position shifted for half a wavelength in the direction vertical to the surface of the sheet (in the propagating direction of the electromagnetic waves), the slots are positioned symmetrically with respect to the center of the longer side of waveguides 1a to 1d (at positions shifted in the upward direction of the surface of the sheet (opposite direction of arrow 600) under the waveguide).

According to this embodiment, dielectric also fills waveguides 1a to 1d. This is for the purpose of reducing the distance between the right and left slots 25 alternately provided to reduce asymmetry characteristic caused by thus alternately providing them. If high frequency microwaves are used, the size of the waveguide itself is small, and therefore dielectric does not have to fill the waveguide.

Slots 25 are filled with dielectric according to this embodiment. This is for the purpose of restraining abnormal discharge which could be generated in the vicinity of slots 25. Also in this case, if countermeasure is taken against such possible abnormal discharge, dielectric does not have to be used for filling the slots.

If the microwave propagation in shower plates 3a to 3d is not surface wave propagation (in the direction parallel to the lid 23 of the vacuum vessel), and is excited in a mode in the direction from the right to left on the surface of the sheet (in the direction vertical to the upper lid 23 of the vacuum vessel), the thickness of shower plates 3a to 3d (the distance from each of dielectric plates 26a to 26d to the plasma excitation plane at positions of first dielectric plates 2a to 2d) may be set to satisfy a resonance condition to the direction from the right to left on the surface of the sheet, so that the excitation can be performed most efficiently. More specifically, the thickness needs only be set to an integral multiple of half a wavelength of the microwave. Strictly speaking, the guide wavelength must be used here, but the free space wavelength of the microwave (though the dielectric constant should be considered if dielectric is used for filling) may be used for designing as first-order approximation, because the propagation space is large enough.

The other structure of the embodiment is basically the same as that of the first embodiment described above, and therefore the same members are denoted with the same reference characters and the description is not provided.

According to this embodiment, the isolation distance between the lower surface of each of shower plates 3a to 3d facing the processing chamber and the conductor wall surface of upper lid 23 provided opposing the upper surface positioned on the opposite side of the lower surface is an integral multiple of half a wavelength of the guide wavelength of the microwave. Therefore, cancellation of microwaves radiated from slots 25 can be prevented, so that more homogeneous and efficient plasma excitation can be performed.

Note that in the first to fifth embodiments described above, the isolation distance between the lower surface of the shower plate and the conductor wall surface of the upper lid is an integral multiple of half a wavelength of the guide wavelength of the microwave, so that plasma excitation can be most efficiently performed.

Note that in the plasma process device according to the present invention, in place of the structure in which substrate 8 is placed horizontally according to the first to sixth embodiments, substrate 8 may be placed upright. Shower plates 3a to 3d may be provided on the side wall of the processing chamber (on the sidewall of vacuum vessel 21) depending upon the placement of substrate 8.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A plasma process device, comprising:
   a processing chamber for performing a processing using plasma;
   microwave guiding means for guiding a microwave into said processing chamber;
   a shower plate having a gas inlet hole for supplying to said processing chamber a reaction gas attaining a plasma state by said microwave, said shower plate having a lower surface facing said processing chamber and an upper surface positioned on the opposite side of the lower surface; and
   a reaction gas supply passage positioned on the upper surface of said shower plate to supply said reaction gas to said gas inlet hole,
   a wall surface of said reaction gas supply passage including an upper surface of said shower plate and an electrically conductive wall surface provided opposing the upper surface.

2. The plasma process device according to claim 1, wherein
   the gas inlet hole in said shower plate is formed penetrating from the upper surface to lower surface of said shower plate, and
   said gas inlet hole at the lower surface of said shower plate has a diameter larger than the diameter of said gas inlet hole at the upper surface of said shower plate.

3. The plasma process device according to claim 1, wherein
   said shower plate includes a plurality of shower plate portions.

4. The plasma process device according to claim 1, wherein
   said shower plate includes dielectric.

5. The plasma process device according to claim 4, wherein
   said dielectric is ceramic containing aluminum nitride as a main constituent.

6. The plasma process device according to claim 1, wherein
   said microwave guiding means includes a single mode microwave waveguide.

7. A plasma process device, comprising:
   a processing chamber for performing a processing using plasma;
   microwave guiding means formed on said processing chamber and having an opening to guide a microwave into said processing chamber;
   a shower plate positioned between said processing chamber and said microwave guiding means and having a gas inlet hole for supplying to said processing chamber a reaction gas attaining a plasma state by said microwave; and
   a reaction gas supply passage formed on said shower plate in a region other than a region positioned under the opening of said microwave guiding means for supplying said reaction gas to said gas inlet hole.

8. The plasma process device according to claim 7, wherein
   said shower plate has a lower surface facing said processing chamber and an upper surface positioned on the opposite side of the lower surface, and
   a wall surface of said reaction gas supply passage includes an upper surface of said shower plate and an electrically conductive wall surface positioned opposing the upper surface.

9. The plasma process device according to claim 8, wherein
   the gas inlet hole in said shower plate is formed penetrating from the upper surface to lower surface of said shower plate, and
   said gas inlet hole at the lower surface of said shower plate has a diameter larger than the diameter of said gas inlet hole at the upper surface of said shower plate.

10. The plasma process device according to claim 7, wherein
    said shower plate includes a plurality of shower plate portions.

11. The plasma process device according to claim 7, wherein
    said shower plate includes dielectric.

12. The plasma process device according to claim 11, wherein
    said dielectric is ceramic containing aluminum nitride as a main constituent.

13. The plasma process device according to claim 7, wherein
    said microwave guiding means includes a single mode microwave waveguide.

14. A plasma process device, comprising:
    a processing chamber for performing a processing using plasma;
    microwave guiding means for guiding a microwave into said processing chamber;
    a shower plate having a gas inlet hole for supplying to said processing chamber a reaction gas attaining a plasma state by said microwave; and
    a reaction gas supply passage positioned on said shower plate and formed in a region other than the transmission path of the microwave guided into said processing chamber by said microwave guiding means for supplying said reaction gas to said gas inlet hole.

15. The plasma process device according to claim 14, wherein
    said shower plate has a lower surface facing said processing chamber and an upper surface positioned on the opposite side of the lower surface, and
    a wall surface of said reaction gas supply passage includes an upper surface of said shower plate and an electrically conductive wall surface provided opposing the upper surface.

16. The plasma process device according to claim 15, wherein the gas inlet hole in said shower plate is formed penetrating from the upper surface to lower surface of said shower plate, and said gas inlet hole at the lower surface of said shower plate has a diameter larger than the diameter of said gas inlet hole at the upper surface of said shower plate.

17. The plasma process device according to claim 14, wherein said shower plate includes a plurality of shower plate portions.

18. The plasma process device according to claim 14, wherein said shower plate includes dielectric.

19. The plasma process device according to claim 18, wherein said dielectric is ceramic containing aluminum nitride as a main constituent.

20. The plasma process device according to claim 14, wherein said microwave guiding means includes a single mode microwave waveguide.

21. A plasma process device, comprising:

a processing chamber for performing a processing using plasma;

microwave guiding means for guiding a microwave into said processing chamber;

a shower plate having a gas inlet hole for supplying to said processing chamber a reaction gas attaining a plasma state by said microwave; and a reaction gas supply passage positioned on said shower plate and isolated from said microwave guiding means by an electrical conductor for supplying said reaction gas to said gas inlet hole.

22. The plasma process device according to claim 21, wherein said shower plate has a lower surface facing said processing chamber and an upper surface positioned on the opposite side of the lower surface, and a wall surface of said reaction gas passage includes an upper surface of said shower plate and an electrically conductive wall surface positioned opposing the upper surface.

23. The plasma process device according to claim 22, wherein the gas inlet hole in said shower plate is formed penetrating from the upper surface to lower surface of said shower plate, and said gas inlet hole at the lower surface of said shower plate has a diameter larger than the diameter of said gas inlet hole at the upper surface of said shower plate.

24. The plasma process device according to claim 21, wherein said shower plate includes a plurality of shower plate portions.

25. The plasma process device according to claim 21, wherein said shower plate includes dielectric.

26. The plasma process device according to claim 25, wherein said dielectric is ceramic containing aluminum nitride as a main constituent.

27. The plasma process device according to claim 21, wherein said microwave guiding means includes a single mode microwave waveguide.

* * * * *